US012660663B2

(12) United States Patent
Lee

(10) Patent No.: US 12,660,663 B2
(45) Date of Patent: Jun. 16, 2026

(54) CIRCUIT BOARD, MANUFACTURING METHOD THEREOF, AND ELECTRONIC COMPONENT PACKAGE INCLUDING THE SAME

(71) Applicant: SAMSUNG ELECTRO-MECHANICS CO., LTD., Suwon-si (KR)

(72) Inventor: Sang-min Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 493 days.

(21) Appl. No.: 18/127,235

(22) Filed: Mar. 28, 2023

(65) Prior Publication Data

US 2024/0213204 A1 Jun. 27, 2024

(30) Foreign Application Priority Data

Dec. 26, 2022 (KR) ........................ 10-2022-0184351

(51) Int. Cl.
| | |
|---|---|
| *H10W 70/685* | (2026.01) |
| *H10W 70/05* | (2026.01) |
| *H10W 70/69* | (2026.01) |
| *H10W 72/20* | (2026.01) |
| *H10W 72/30* | (2026.01) |
| *H10W 74/15* | (2026.01) |
| *H10W 90/00* | (2026.01) |

(52) U.S. Cl.
CPC ......... *H10W 70/685* (2026.01); *H10W 70/05* (2026.01); *H10W 70/69* (2026.01); *H10W 72/252* (2026.01); *H10W 72/387* (2026.01);

*H10W 74/15* (2026.01); *H10W 90/00* (2026.01); *H10W 90/724* (2026.01); *H10W 90/734* (2026.01)

(58) Field of Classification Search
None
See application file for complete search history.

(56) References Cited

U.S. PATENT DOCUMENTS

| | | | | |
|---|---|---|---|---|
| 7,682,972 B2 * | 3/2010 | Hurwitz | ............ | H01L 23/49822 |
| | | | | 438/618 |
| 2005/0082680 A1 * | 4/2005 | Liu | .................... | H01L 23/49894 |
| | | | | 257/E21.511 |

(Continued)

FOREIGN PATENT DOCUMENTS

| | | |
|---|---|---|
| KR | 10-2021-0082969 A | 7/2021 |
| KR | 10-2281458 B1 | 7/2021 |
| KR | 10-2021-0098659 A | 8/2021 |

*Primary Examiner* — Hung K Vu
(74) *Attorney, Agent, or Firm* — Morgan, Lewis & Bockius LLP

(57) ABSTRACT

A circuit board according to an embodiment includes: a first insulating layer that does not include a reinforcing material; a conductive pad that protrudes above a surface of the first insulating layer; a dam that protrudes from the surface of the first insulating layer and is disposed outside a region where the conductive pad is disposed on a plane; and a second insulating layer that is disposed below the first insulating layer and includes a reinforcing material. A height of the dam based on the surface of the first insulating layer is higher than a height of the conductive pad.

25 Claims, 13 Drawing Sheets

(56)　　　　　　　References Cited

U.S. PATENT DOCUMENTS

| | | | |
|---|---|---|---|
| 2011/0095421 A1* | 4/2011 | Kim | H01L 21/563 |
| | | | 257/E21.511 |
| 2014/0167263 A1* | 6/2014 | Wu | H01L 21/565 |
| | | | 257/773 |
| 2021/0202397 A1 | 7/2021 | Kim et al. | |
| 2021/0242101 A1 | 8/2021 | Kim et al. | |

* cited by examiner

FIG. 1

CIRCUIT BOARD, MANUFACTURING METHOD THEREOF, AND ELECTRONIC COMPONENT PACKAGE INCLUDING THE SAME

CROSS-REFERENCE TO RELATED APPLICATION

This application claims priority to and the benefit of Korean Patent Application No. 10-2022-0184351 filed in the Korean Intellectual Property Office on Dec. 26, 2022, the entire contents of which are incorporated herein by reference.

TECHNICAL FIELD

The present disclosure relates to a circuit board, a manufacturing method thereof, and an electronic component package including the same.

BACKGROUND

Recently, a system in package (SIP) has been used to implement a high-performance central processing unit (CPU) by bundling two or more ICs into one package to operate as a single chip. Since a memory is mounted together on one circuit board, a silicon interposer is applied to the SIP. Accordingly, a size of the circuit board increases so that a defect due to warpage is likely to occur.

In addition, a thin package is required in the high-performance central processing unit (CPU), and a coreless substrate without a core member having a predetermined thickness is used for this purpose. Since the coreless substrate does not have the core member, the coreless substrate may be formed thin while forming more layers when the coreless substrate is compared with a circuit board having the same thickness, but the defect due to warpage are likely to occur.

When the package is assembled, the defect due to warpage that occurs in the coreless substrate includes a crack that occurs in a bump when a die and the bump are connected, a crack that occurs in a via layer due to thermal stress, a solder bridge where solder balls are shorted, or the like.

In particular, an underfill filled between the die and the coreless substrate may go over a dam due to warpage of the coreless substrate so that the underfill contaminates a pad of a circuit element such as a multi-layer ceramic capacitor (MLCC) or the like located adjacent to the dam.

The above information disclosed in this Background section is only for enhancement of understanding of the background of the disclosure, and therefore it may contain information that does not form the prior art that is already known in this country to a person of ordinary skill in the art.

SUMMARY

Embodiments are to provide a circuit board, a manufacturing method thereof, and an electronic component package including the circuit board capable of minimizing a defect due to warpage such as bending, twisting, or the like.

However, problems to be solved by the embodiments are not limited to the above-described problem and may be variously extended in a range of technical ideas included in the embodiments.

A circuit board according to an embodiment includes: a first insulating layer; a conductive pad that protrudes above a surface of the first insulating layer; a dam that protrudes from the surface of the first insulating layer and is disposed outside a region where the conductive pad is disposed on a plane; and a second insulating layer that includes a material different from the first insulating layer, is disposed below the first insulating layer, and includes a reinforcing material. A height of the dam based on the surface of the first insulating layer is higher than a height of the conductive pad.

The dam may include: a main dam protruding above the surface of the first insulating layer; and an auxiliary dam covering the main dam.

The auxiliary dam may include: a lower auxiliary dam including nickel; and an upper auxiliary dam that is disposed on the lower auxiliary dam. The upper auxiliary dam may include a first upper auxiliary dam including nickel and a second upper auxiliary dam including gold The conductive pad may include: a main pad protruding above the surface of the first insulating layer; and a first auxiliary pad covering the main pad. A thickness of the auxiliary dam measured in a direction perpendicular to the surface of the first insulating layer may be greater than a thickness of the first auxiliary pad.

The first auxiliary pad may include: a first lower auxiliary layer including nickel; and a first upper auxiliary layer that is disposed on the first lower auxiliary layer and includes gold.

The circuit board may further include: a first via layer disposed at the first insulating layer; a first circuit wire connected to the first via layer; a second via layer disposed at the second insulating layer; and a second circuit wire connected to the second via layer. The conductive pad may be connected to the first via layer.

The first insulating layer may include a silica filler, the second insulating layer may include a silica filler and the reinforcing material, and the reinforcing material may include a glass cloth.

The circuit board may further include a solder resist layer that is disposed below the second insulating layer and has an opening overlapping the second circuit wire.

The circuit board may further include a second auxiliary pad covering a surface of the second circuit wire that overlaps the opening.

A minimum diameter of the second via layer may be greater than a minimum diameter of the first via layer.

A portion of the conductive pad may be buried in the first insulating layer.

The first insulating layer may not include the reinforcing material.

The circuit board may further include a peripheral pad on the first insulating layer, wherein the peripheral pad is disposed outside a region where the dam is disposed on a plane.

A manufacturing method of a circuit board according to an embodiment includes: forming a plurality of main pads and a main dam disposed outside a region where the plurality of main pads are disposed on a carrier substrate; forming a first insulating layer that covers the main pad and the main dam on the carrier substrate; forming a second insulating layer that includes a material different from the first insulating layer and includes a reinforcing material on the first insulating layer; separating the carrier substrate from the first insulating layer; protruding the main pad and the main dam above a surface of the first insulating layer; and forming a dam that includes the main dam and an auxiliary dam covering the main dam and has a height higher than a height of a conductive pad including the main pad and a first auxiliary pad covering the main pad based on the surface of the first insulating layer using a plating process.

The manufacturing method may further include: forming a first via layer penetrating the first insulating layer; forming a first circuit wire connected to the first via layer on the first insulating layer; forming a second via layer penetrating the second insulating layer, and forming a second circuit wire connected to the second via layer on the second insulating layer.

A minimum diameter of the second via layer may be formed larger than a minimum diameter of the first via layer.

The manufacturing method may further include forming a solder resist layer having an opening overlapping the second circuit wire on the second insulating layer. The plating process may include: forming a first plating resist having an opening area overlapping the main dam and a second plating resist blocking the opening of the solder resist layer; forming a lower auxiliary dam covering the main dam using a first electroless plating process; removing the first plating resist and the second plating resist; and forming the auxiliary dam by forming an upper auxiliary dam on the lower auxiliary dam using a second electroless plating process.

The upper auxiliary dam may be formed at the same time when the first auxiliary pad covering the main pad and a second auxiliary pad covering a surface of the second circuit wire overlapping the opening are formed.

An electronic component package according to an embodiment includes: a circuit board including a first insulating layer, a conductive pad that protrudes above a surface of the first insulating layer, and a dam that protrudes from the surface of the first insulating layer and is disposed outside a region where the conductive pad is disposed on a plane; an electronic component disposed above the circuit board; a conductive bonding member that connects the conductive pad of the circuit board to the electronic component; and an underfill that is disposed between the electronic component and the circuit board and is surrounded by the dam. A height of the dam based on the surface of the first insulating layer is higher than a height of the conductive pad.

The circuit board may further include a second insulating layer that includes a material different from the first insulating layer, is disposed below the first insulating layer, and includes a reinforcing material.

A circuit board according to an embodiment includes a first insulating layer; a first conductive pad including a portion embedded in the first insulating layer and another portion protruding from a surface of the first insulating layer; and a dam, disposed outside a region where the first conductive pad is disposed, including a portion embedded in the first insulating layer and another portion protruding from the surface of the first insulating layer. A height of the dam based on the surface of the first insulating layer is higher than a height of the first conductive pad.

The dam may include a main dam protruding above the surface of the first insulating layer and including the portion of the dam embedded in the first insulating layer, and an auxiliary dam covering the main dam.

The first conductive pad may include a first main pad protruding above the surface of the first insulating layer and including the portion of the first conductive pad embedded in the first insulating layer, and a first auxiliary pad covering the first main pad.

A radius of curvature of an upper corner of the first main pad may be greater than a radius of curvature of a corner of a first circuit wire disposed on the first insulating layer.

The circuit board may further include a second insulating layer disposed below the first insulating layer and including a reinforcing material.

A minimum diameter of a second via layer in the second insulating layer may be greater than a minimum diameter of a first via layer in the first insulating layer.

The circuit board may further include a second conductive pad including a portion embedded in the first insulating layer and another portion protruding from the surface of the first insulating layer. The second conductive pad may be disposed outside a region of the dam, and may have a height less than that of the dam with respect to the surface of the first insulating layer.

The second conductive pad may include a second main pad protruding above the surface of the first insulating layer and including the portion of the second conductive pad embedded in the first insulating layer, and a second auxiliary pad covering the second main pad.

According to the embodiments, a height of a dam disposed outside a region where a plurality of conductive pads are disposed may be formed higher than a height of the conductive pad so that it is possible to prevent an underfill from flowing into an external circuit element or the like beyond a dam.

In addition, some insulating layers of a coreless substrate may include a reinforcing material to prevent warpage of the coreless substrate in one direction.

In addition, diameters of some via layers penetrating some insulating layers including the reinforcing material may be formed larger than diameters of other via layers penetrating other insulating layers not including the reinforcing material, so that it is possible to prevent a defect such as a crack or the like from occurring in some via layers by stress concentrated in some insulating layers.

As described above, since reliability of a circuit board including the coreless substrate may be improved, thinning of a package may be improved.

It is obvious that an effect of the embodiments is not limited to the above-described effect, and may be variously extended without departing from the spirit and scope of the present disclosure.

BRIEF DESCRIPTION OF THE DRAWINGS

FIG. 1 is a cross-sectional view of a circuit board according to an embodiment.

DETAILED DESCRIPTION OF THE EMBODIMENTS

Figure 2:
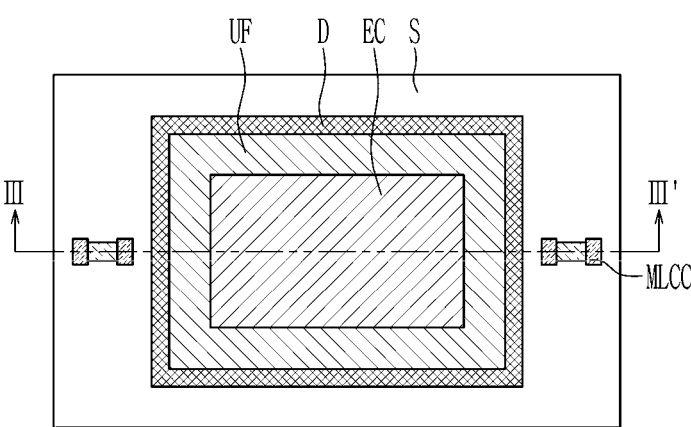
FIG. 2 is a plane view of an electronic component package including the circuit board of FIG. 1.

The present disclosure will be described more fully hereinafter with reference to the accompanying drawings, in which embodiments of the disclosure are shown. As those skilled in the art would realize, the described embodiments may be modified in various different ways, all without departing from the spirit or scope of the present disclosure.

In order to clearly describe the present disclosure, parts or portions that are irrelevant to the description are omitted, and identical or similar constituent elements throughout the specification are denoted by the same reference numerals.

Further, the accompanying drawings are provided only in order to allow embodiments disclosed in the present specification to be easily understood and are not to be interpreted as limiting the spirit disclosed in the present specification, and it is to be understood that the present disclosure includes all modifications, equivalents, and substitutions without departing from the scope and spirit of the present disclosure.

Further, in the drawings, the size and thickness of each element are arbitrarily illustrated for ease of description, and the present disclosure is not necessarily limited to those illustrated in the drawings. In the drawings, the thickness of layers, films, panels, regions, etc., are exaggerated for clarity. In the drawings, for ease of description, the thicknesses of some layers and areas are exaggerated.

It will be understood that when an element such as a layer, film, region, area, or substrate is referred to as being "on" or "above" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

Furthermore, throughout the specification, "connected" does not only mean when two or more elements are directly connected, but also when two or more elements are indirectly connected through other elements, and when they are physically connected or electrically connected, and further, it may be referred to by different names depending on a position or function, and may also be referred to as a case in which respective parts that are substantially integrated are linked to each other.

Hereinafter, various embodiments and variations will be described in detail with reference to the drawings.

Figure 1:
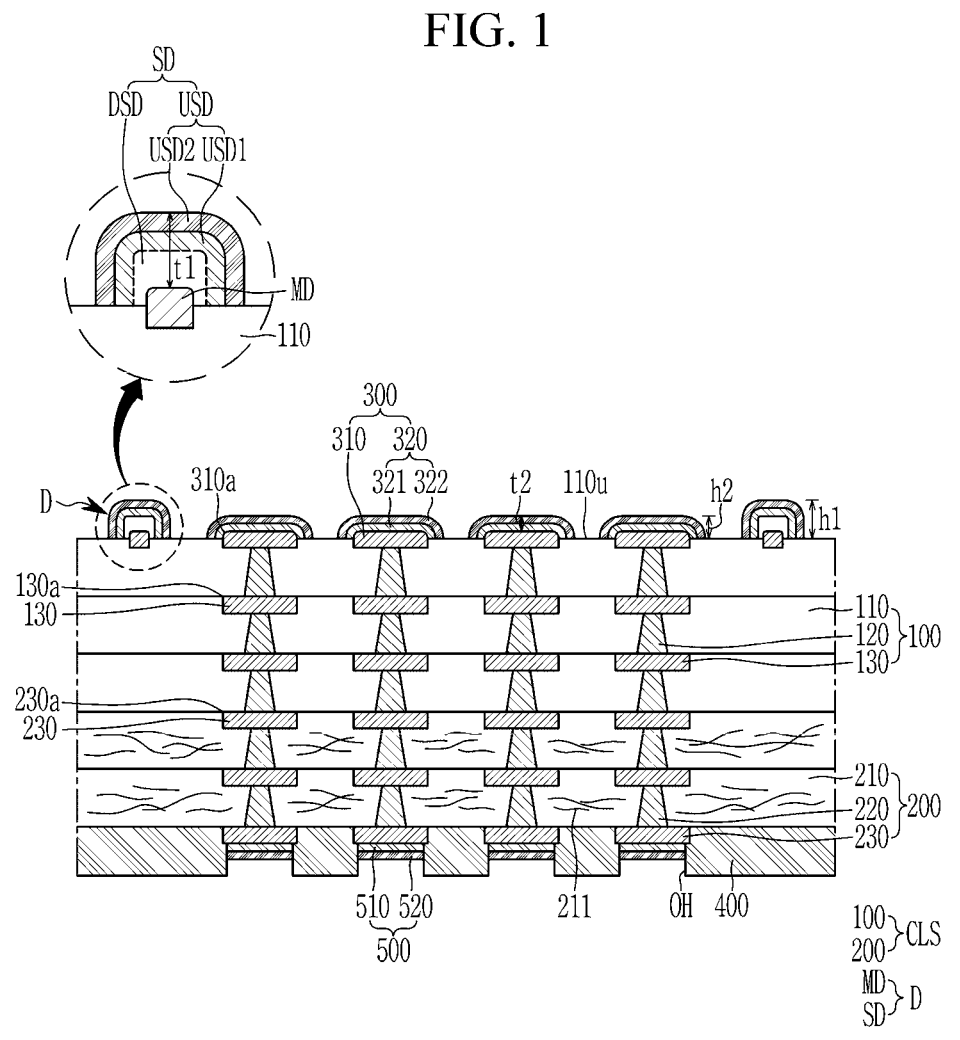
Figure 3:
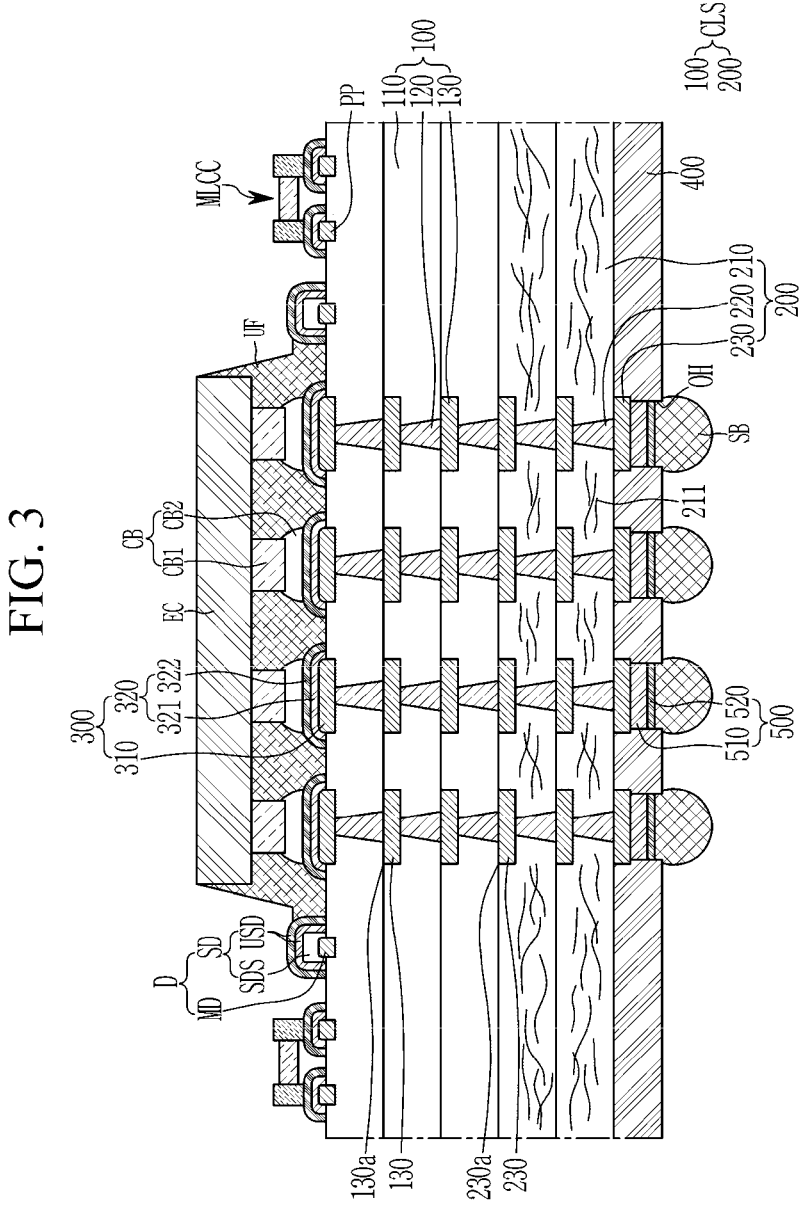
FIG. 3 is a cross-sectional view taken along a line III-III' of FIG. 2.

Referring to FIGS. 1 to 3, a circuit board according to an embodiment and an electronic component package including the circuit board will be described.

FIG. 1 is a cross-sectional view of the circuit board according to the embodiment.

As shown in FIG. 1, the circuit board according to the embodiment includes at least one first layer portion (or at least one first layer unit) 100, at least one second layer portion (or at least one second layer unit) 200, a plurality of conductive pads 300, a dam D, a solder resist layer 400, and a plurality of second auxiliary pads 500. Hereinafter, for convenience of explanation, the first layer portion 100 and the second layer portion 200 are collectively defined as a coreless substrate CLS.

The first layer portion 100 may be disposed above or on the second layer portion 200. The first layer portion 100 may include a first insulating layer 110, a first via layer 120, and a first circuit wire 130.

The first insulating layer 110 may include a thermosetting resin such as epoxy resin, polyimide, or the like, or a thermoplastic resin such as polyethylene (PE), polycarbonate (PC), polyvinyl chloride (PVC), or the like. The first insulating layer 110 may include an Ajinomoto build-up film (ABF) or the like. The ABF may be a polymeric epoxy film available from Ajinomoto Fine-Techno Company, Inc. The first insulating layer 110 may include a silica filler.

The first via layer 120 may pass through the first insulating layer 110, and may be connected to the first circuit wire 130. The first via layer 120 may include a conductive material such as copper (Cu), aluminum (Al), silver (Ag), tin (Sn), gold (Au), nickel (Ni), lead (Pb), titanium (Ti), an alloy thereof, or the like. A side surface of the first via layer 120 may be formed to be tapered. That is, the side surface of the first via layer 120 may have an obtuse angle with respect to a plane parallel to a surface of the first insulating layer 110.

The first circuit wire 130 may be disposed below the first insulating layer 110, and may transmit an electrical signal. The first circuit wire 130 may be disposed in various patterns. The first circuit wire 130 may include a conductive material such as copper (Cu), aluminum (Al), silver (Ag), tin (Sn), gold (Au), nickel (Ni), lead (Pb), titanium (Ti), an alloy thereof, or the like.

In the present embodiment, three first layer portions 100 are stacked, but the present disclosure is not necessarily limited thereto, and various numbers of first layer portions 100 may be stacked.

The second layer portion 200 may include a second insulating layer 210, a second via layer 220, and a second circuit wire 230.

The second insulating layer 210 may include a thermosetting resin such as epoxy resin, polyimide, or the like, or a thermoplastic resin such as polyethylene (PE), polycarbonate (PC), polyvinyl chloride (PVC), or the like. For example, the second insulating layer 210 may include an Ajinomoto build-up film (ABF) or the like. The second insulating layer 210 may include a silica filler.

In addition, the second insulating layer 210 may further include a reinforcing material 211 capable of preventing warpage (or deformation) due to a physical external force. The reinforcing material 211 may include a glass cloth or the like. As described above, since the second insulating layer 210 includes the reinforcing material 211, warpage in one direction of the coreless substrate CLS due to thermal stress or the like during a manufacturing process may be prevented.

The second via layer 220 may pass through the second insulating layer 210, and may be connected to the second circuit wire 230. The second via layer 220 may include a conductive material such as copper (Cu), aluminum (Al), silver (Ag), tin (Sn), gold (Au), nickel (Ni), lead (Pb), titanium (Ti), an alloy thereof, or the like. A side surface of the second via layer 220 may be formed to be tapered. That is, the side surface of the second via layer 220 may have an obtuse angle with respect to a plane parallel to a surface of the second insulating layer 210.

The second circuit wire 230 may be disposed below the second insulating layer 210, and may transmit an electrical signal. The second circuit wire 230 may be disposed in various patterns. The second circuit wire 230 may include a conductive material such as copper (Cu), aluminum (Al), silver (Ag), tin (Sn), gold (Au), nickel (Ni), lead (Pb), titanium (Ti), an alloy thereof, or the like.

In the present embodiment, two second layer portions 200 are stacked, but the present disclosure is not necessarily limited thereto, and various numbers of second layer portions 200 may be stacked.

The plurality of conductive pads 300 may be connected to the first circuit wire 130 through the first via layer 120, and may protrude above a surface 110u of the first insulating layer 110. In addition, a lower surface of the conductive pad 300 may be buried within the first insulating layer 110.

The conductive pad 300 may include a main pad 310 and a first auxiliary pad 320.

The main pad 310 may protrude above the surface 110u of the first insulating layer 110. The main pad 310 may include copper (Cu), gold (Au), silver (Ag), nickel (Ni), or the like.

The first auxiliary pad 320 may cover the main pad 310. The first auxiliary pad 320 may include a first lower auxiliary layer 321 and a first upper auxiliary layer 322 formed by a second electroless plating process that is a surface treatment process. The first upper auxiliary layer 322 is disposed on the first lower auxiliary layer 321. The first lower auxiliary layer 321 may include nickel (Ni), palladium (Pd), or the like, and the first upper auxiliary layer 322 may include gold (Au). Here, the second electroless plating process may include an electroless plating process such as electroless nickel electroless palladium immersion gold (ENEPIG), electroless nickel immersion gold (ENIG), or the like. The ENEPIG is a plating process in which electroless palladium is disposed between electroless nickel and substitution gold to prevent nickel corrosion during substitution gold plating that is a problem of the ENIG.

In this case, an upper corner 310a of the main pad 310 may have a curved shape. Unlike a corner 130a of the first circuit wire 130 and a corner 230a of the second circuit wire 230 having an angular shape, the upper corner 310a of the main pad 310 may have a curved shape. That is, a radius of curvature of the upper corner 310a of the main pad 310 may be greater than a radius of curvature of the corner 130a of the first circuit wire 130 or a radius of curvature of the corner 230a of the second circuit wire 230. Therefore, since stress is not concentrated on the protruding upper corner 310a of the main pad 310 even when warpage occurs in the coreless substrate CLS, an occurrence of a defect such as a crack or the like in the main pad 310 may be prevented.

The dam D may surround the plurality of conductive pads 300 on a plane. The dam D may include a main dam MD and an auxiliary dam SD.

The main dam MD may be disposed at the same layer as the main pad 310, and may protrude above the surface 110u of the first insulating layer 110. The main dam MD may include copper (Cu), gold (Au), silver (Ag), nickel (Ni), or the like.

The auxiliary dam SD may cover the main dam MD. The auxiliary dam SD may include a lower auxiliary dam DSD and an upper auxiliary dam USD.

The lower auxiliary dam DSD may be formed by a first electroless plating process, and may include nickel (Ni).

The upper auxiliary dam USD may be disposed on the lower auxiliary dam DSD. The upper auxiliary dam USD may include a first upper auxiliary dam USD1 and a second upper auxiliary dam USD2 formed by the second electroless plating process. The first upper auxiliary dam USD1 may include nickel (Ni), palladium (Pd), or the like, and the second upper auxiliary dam USD2 may include gold (Au).

Here, a thickness t1 of the auxiliary dam SD measured in a direction perpendicular to the surface 110u of the first insulating layer 110 may be greater than a thickness t2 of the first auxiliary pad 320. Therefore, a height h1 of the dam D based on the surface 110u of the first insulating layer 110 may be higher than a height h2 of the conductive pad 300 based on the surface 110u of the first insulating layer 110.

Accordingly, it is possible to prevent an underfill UF filled between an electronic component EC and the first layer portion 100 from flowing into a circuit element (e.g., a multi-layer ceramic capacitor (MLCC) or the like) disposed above the first layer portion 100 beyond the dam D. Accordingly, reliability of the circuit board may be improved by preventing contamination of a peripheral pad PP of the circuit element disposed outside the electronic component. Here, the peripheral pad PP on the first insulating layer 110 may be disposed outside a region where the dam D is disposed on a plane.

The solder resist layer 400 may be disposed below the second insulating layer 210, and may cover the second circuit wire 230. The solder resist layer 400 may have an opening (or an opening portion) OH overlapping the second circuit wire 230 on a plane. The solder resist layer 400 may include an insulating material such as a solder resist or the like.

The second auxiliary pad 500 may cover a surface of the second circuit wire 230 overlapping the opening OH of the solder resist layer 400. The second auxiliary pad 500 may be adjacent to the second insulating layer 210. The second auxiliary pad 500 may include a second lower auxiliary layer 510 and a second upper auxiliary layer 520 formed by the second electroless plating process that is the surface treatment process. In FIG. 1, the second upper auxiliary layer 520 may be disposed below the second lower auxiliary layer 510, and the second upper auxiliary layer 520 may cover the second lower auxiliary layer 510. The second lower auxiliary layer 510 may include nickel (Ni), palladium (Pd), or the like, and the second upper auxiliary layer 520 may include gold (Au).

The second insulating layer 210 adjacent to the second auxiliary pad 500 includes the reinforcing material 211 to minimize warpage of the coreless substrate CLS so that solder balls SB bonded to the second auxiliary pad 500 are prevented from being shorted each other.

As described above, in the circuit board according to the embodiment, the second insulating layer 210 of the coreless substrate CLS may include the reinforcing material 211, and the upper corner 300a of the protruding conductive pad 300 may have a curved shape. As a result, even when warpage occurs in the coreless substrate CLS, an occurrence of a defect such as a crack or the like in the conductive pad 300, the second via layer 220, or the like may be minimized.

Hereinafter, the electronic component package including the circuit board of FIG. 1 will be described in detail with reference to the drawings.

FIG. 2 is a plane view of the electronic component package including the circuit board of FIG. 1, and FIG. 3 is a cross-sectional view taken along a line III-III' of FIG. 2.

As shown in FIGS. 2 and 3, the electronic component package according to an embodiment includes the circuit board S, the electronic component EC, a conductive bonding member (or a conductive adhesive member) CB, and the underfill UF.

The circuit board S includes the at least one first layer portion 100, the at least one second layer portion 200, the conductive pad 300, the dam D, the solder resist layer 400, and the second auxiliary pad 500. Since the circuit board S is described in detail, a detailed description thereof will be omitted.

The electronic component EC may be an integrated circuit die in which hundreds to millions of elements are integrated into a single chip. For example, the electronic component EC may include a processor chip such as a central processor (e.g., a CPU), a graphics processor (e.g., a GPU), a field programmable gate array (FPGA), a digital signal processor, a cryptographic processor, a microprocessor, a microcontroller, or the like, and specifically, the electronic component EC may include an application processor (AP), but the present disclosure is not limited thereto, and the electronic component EC may include a volatile memory (e.g., a DRAM), a non-volatile memory (e.g., a ROM), a memory such as a flash memory or the like, an analog-to-digital converter, a logic such as an application-specific IC (ASIC) or the like, or the like.

The conductive bonding member CB may electrically connect the electronic component EC and the conductive pad 300. The conductive bonding member CB may include a bump CB1 installed at signal wiring of the electronic component EC, and an auxiliary bonding member CB2 disposed between the bump CB1 and the conductive pad 300 to improve adhesion and conductivity. The bump CB1 may include a conductive material such as copper (Cu), aluminum (Al), silver (Ag), tin (Sn), gold (Au), nickel (Ni), lead (Pb), titanium (Ti), an alloy thereof, or the like. The auxiliary bonding member CB2 may include a solder or the like. In the present embodiment, the bump CB1 has a pillar shape, but the present disclosure is not necessarily limited thereto, and the bump CB1 may also include a ball-shaped bump.

The underfill UF may be filled between the electronic component EC and the first layer portion 100, and may fix the electronic component EC. Since the underfill UF is surrounded by the dam D, the underfill is prevented from flowing into a surrounding circuit element beyond the dam. In particular, since the height h1 of the dam D based on the surface 110$u$ of the first insulating layer 110 may be higher than the height h2 of the conductive pad 300 based on the surface 110$u$ of the first insulating layer 110, it is possible to effectively prevent the underfill UF from flowing over the dam D and flowing into the surrounding circuit element or the like disposed above the first layer portion 100.

Referring to FIGS. 4 to 11 together with FIGS. 1 to 3, a manufacturing method of a circuit board according to an embodiment will be described in detail.

FIGS. 4 to 11 are cross-sectional views sequentially illustrating the manufacturing method of the circuit board according to the embodiment.

Figure 4:
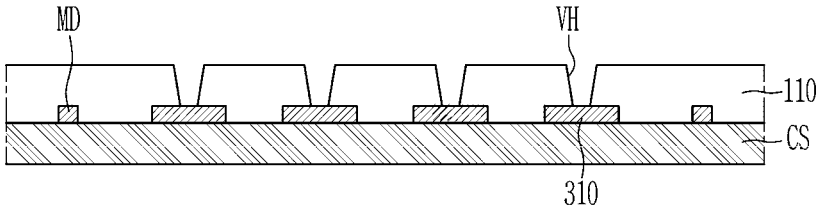
FIGS. 4 to 11 are cross-sectional views sequentially illustrating a manufacturing method of a circuit board according to an embodiment.

As shown in FIG. 4, a plurality of main pads 310 and the main dam MD are formed on a carrier substrate CS. The main dam MD may surround the plurality of main pads 310 on a plane. The carrier substrate CS may be a substrate that may be separated from the main pad 310 and the main dam M in a subsequent process. The carrier substrate CS may include a copper foil stacking plate or the like. Then, the first insulating layer 110 covering the main pad 310 and the main dam MD is formed on the carrier substrate CS. The first insulating layer 110 may not include the reinforcing material 211. Then, a via hole VH overlapping the main pad 310 is formed at the first insulating layer 110 using a photolithography process (or a photo etching process).

Figure 5:
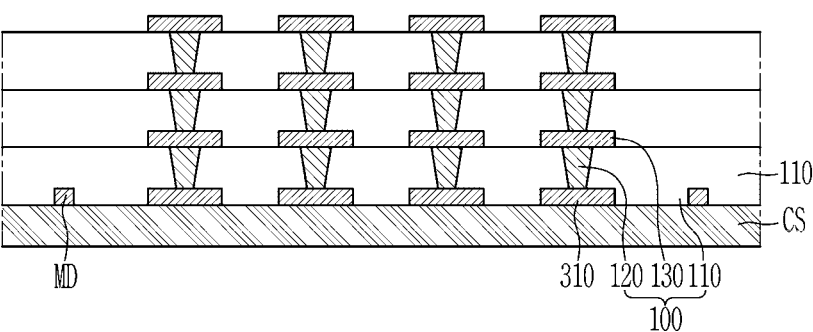

As shown in FIG. 5, the first via layer 120 is formed by filling the via hole VH of the first insulating layer 110. In this case, the side surface of the first via layer 120 may be formed to be inversely tapered. Then, the first circuit wire 130 connected to the first via layer 120 is formed on the first insulating layer 110. Here, the first insulating layer 110, the first via layer 120, and the first circuit wire 130 together constitute the first layer portion 100. Then, the first layer portion 100 may be repeatedly stacked. In the present embodiment, three first layer portions 100 are formed, but the present disclosure is not necessarily limited thereto, and various numbers of first layer portions 100 may be formed.

Figure 6:
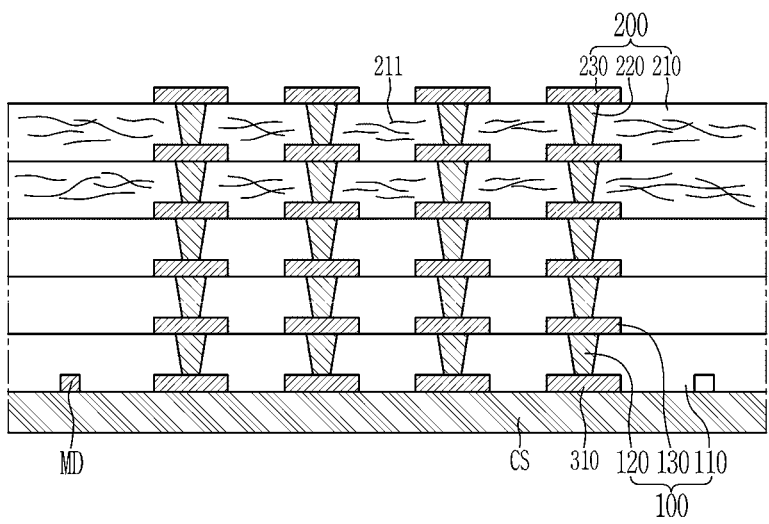

As shown in FIG. 6, the second insulating layer 210 is formed on the first layer portion 100. The second insulating layer 210 may include the reinforcing material 211. Then, the second via layer 220 passing through the second insulating layer 210 is formed using a photolithography process. In this case, the side surface of the second via layer 220 may be formed to be inversely tapered. Then, the second circuit wire 230 connected to the second via layer 220 is formed on the second insulating layer 210. Here, the second insulating layer 210, the second via layer 220, and the second circuit wire 230 together constitute the second layer portion 200. Then, the second layer portion 200 may be repeatedly stacked. In the present embodiment, two second layer portions 200 are formed, but the present disclosure is not necessarily limited thereto, and various numbers of second layer portions 200 may be formed.

Figure 7:
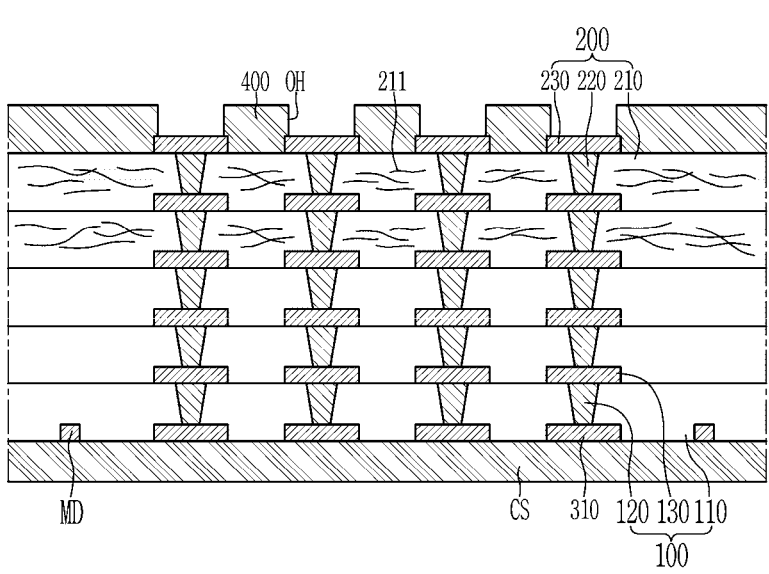

As shown in FIG. 7, the solder resist layer 400 having the opening OH overlapping the second circuit wire 230 is formed on the second layer portion 200. The opening OH may be formed by performing processes such as exposure, curing, development, and the like on the solder resist layer 400 using a mask.

Figure 8:
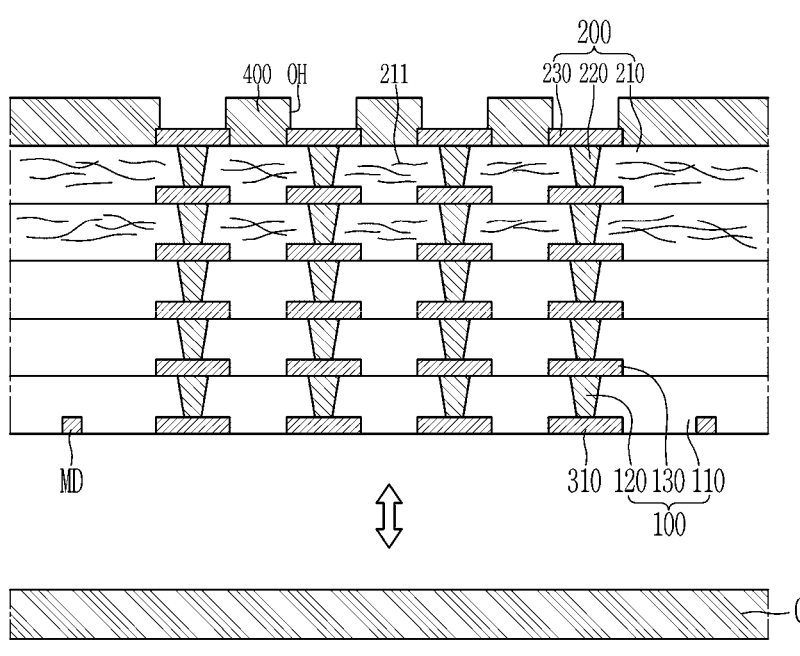

As shown in FIG. 8, the carrier substrate CS is separated from the first layer portion 100. That is, the carrier substrate CS is separated from the first insulating layer 110 of the first layer portion 100.

Figure 9:
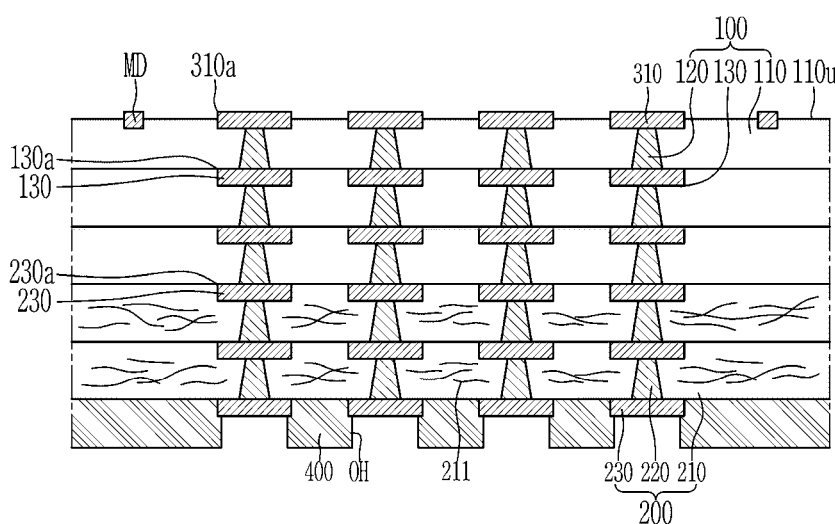

As shown in FIG. 9, the coreless substrate CLS including the first layer portion 100 and the second layer portion 200 is turned over. Then, a surface of the first insulating layer 110 of the uppermost first layer portion 100 among the plurality of first layer portions 100 is etched to protrude the main pad 310 and the main dam MD above the surface 110$u$ of the first insulating layer 110 of the first layer portion 100. In this case, the upper corner 310$a$ of the main pad 310 and an upper corner MDa of the main dam MD may have an angular shape.

Figure 10:
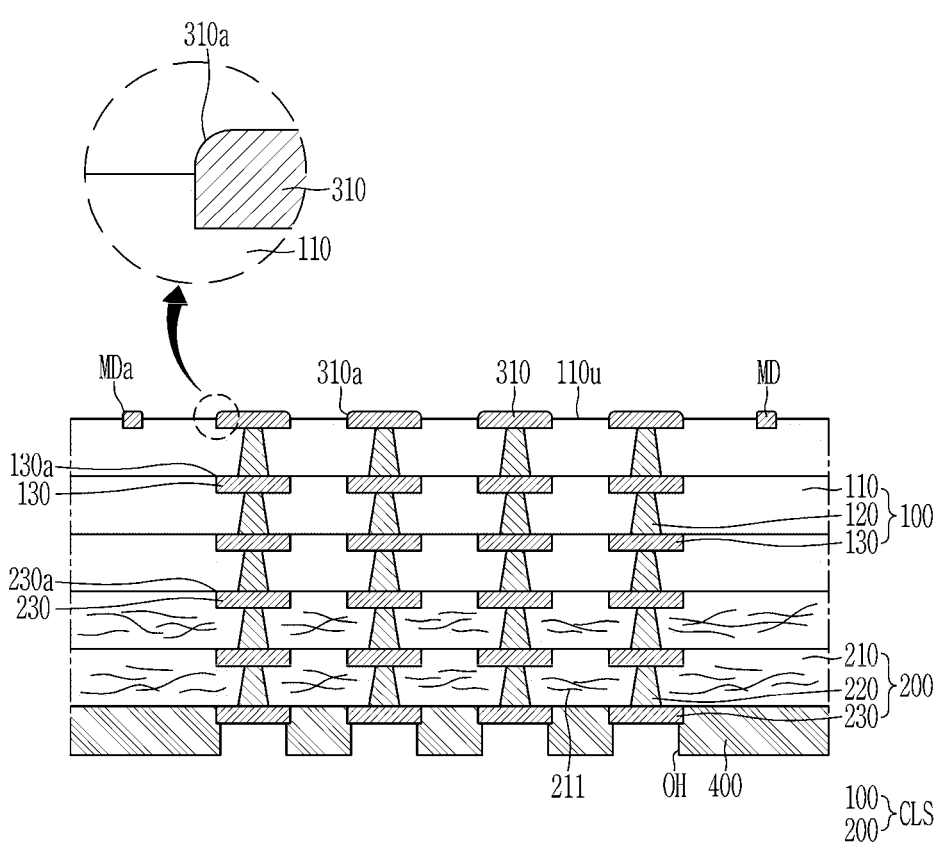

As shown in FIG. 10, the upper corner 310$a$ of the main pad 310 and the upper corner MDa of the main dam MD are processed to make the upper corner 310$a$ of the main pad 310 and the upper corner MDa of the main dam MD into a curved shape. In this case, the upper corner 310$a$ of the main pad 310 may be formed into a curved shape using a photolithography process, a laser process, or the like.

Figure 11:
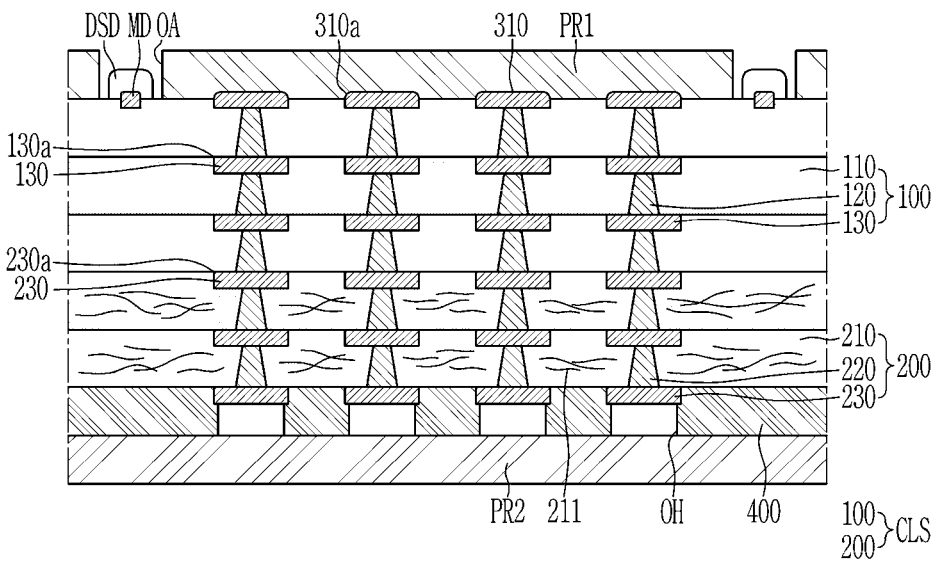

As shown in FIG. 11, a first plating resist PR1 having an opening area OA that overlaps the main dam MD is formed on the first insulating layer 110, and at the same time, a second plating resist PR2 blocking the opening OH is formed below the solder resist layer 400.

Then, the lower auxiliary dam DSD covering the main dam MD is formed using the first electroless plating process.

As shown in FIG. 1, the first plating resist PR1 and the second plating resist PR2 are removed. Then, the auxiliary dam SD is completed by forming the upper auxiliary dam USD on the lower auxiliary dam DSD through the second electroless plating process. The auxiliary pad 300 may be completed by forming the upper auxiliary dam USD and simultaneously forming the first auxiliary pad 320 covering the main pad 310. In addition, the second auxiliary pad 500 covering the surface of the second circuit wire 230 overlapping the opening OH of the second insulating layer 210 may be formed while forming the upper auxiliary dam USD. Here, the thickness t1 of the auxiliary dam SD may be greater than the thickness t2 of the first auxiliary pad 320. Accordingly, the height h1 of the dam D based on the surface 110$u$ of the first insulating layer 110 may be higher than the height h2 of the conductive pad 300 based on the surface 110$u$ of the first insulating layer 110.

Accordingly, it is possible to prevent the underfill UF filled between the electronic component EC and the first layer portion 100 from flowing into the circuit element (e.g., the multi-layer ceramic capacitor (MLCC) or the like) disposed above the first layer portion 100 beyond the dam D.

As described above, since the second insulating layer 210 of the coreless substrate CLS includes the reinforcing material 211 in an embodiment, it is possible to prevent warpage in one direction of the coreless substrate CLS.

In addition, the upper corner 300$a$ of the main pad 310 protruding from the coreless substrate CLS may have a curved shape so that an occurrence of a defect such as a crack or the like in the main pad 310 is prevented even when warpage occurs in the coreless substrate CLS.

On the one hand, in the above embodiment, a minimum diameter of the first via layer and a minimum diameter of the second via layer are the same, but another embodiment in which the minimum diameter of the second via layer is larger than the minimum diameter of the first via layer is also possible.

Hereinafter, a circuit board according to another embodiment will be described in detail with reference to FIG. 12.

Figure 12:
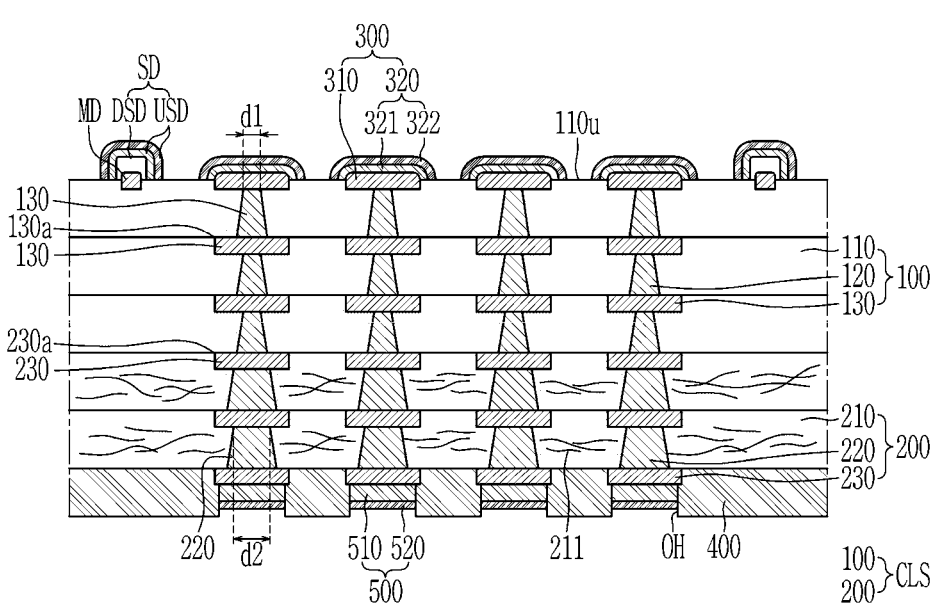
FIG. 12 is a cross-sectional view of a circuit board according to another embodiment.

FIG. 12 is a cross-sectional view of the circuit board according to the other embodiment.

The other embodiment shown in FIG. 12 is substantially the same as the embodiment shown in FIG. 1 except that the minimum diameter of the second via layer is larger than the minimum diameter of the first via layer, and thus a repeated description thereof is omitted.

As shown in FIG. 12, the circuit board according to the other embodiment includes the at least one first layer portion (or the at least one first layer unit) 100, the at least one second layer portion (or the at least one second layer unit) 200, the plurality of conductive pads 300, the dam D, the solder resist layer 400, and the second auxiliary pad 500.

Here, a minimum diameter d2 of the second via layer 220 of the second layer portion 200 may be greater than a minimum diameter d1 of the first via layer 120 of the first layer portion 100.

As described above, the minimum diameter d2 of the second via layer 220 penetrating the second insulating layer 210 including the reinforcing material 211 may be formed larger than the minimum diameter d1 of the first via layer 120 penetrating the first insulating layer 110 not including the reinforcing material 211, so that a defect such as a crack or the like is prevented from occurring in the second via layer 220 by stress concentrated in the second insulating layer 210.

Figure 13:
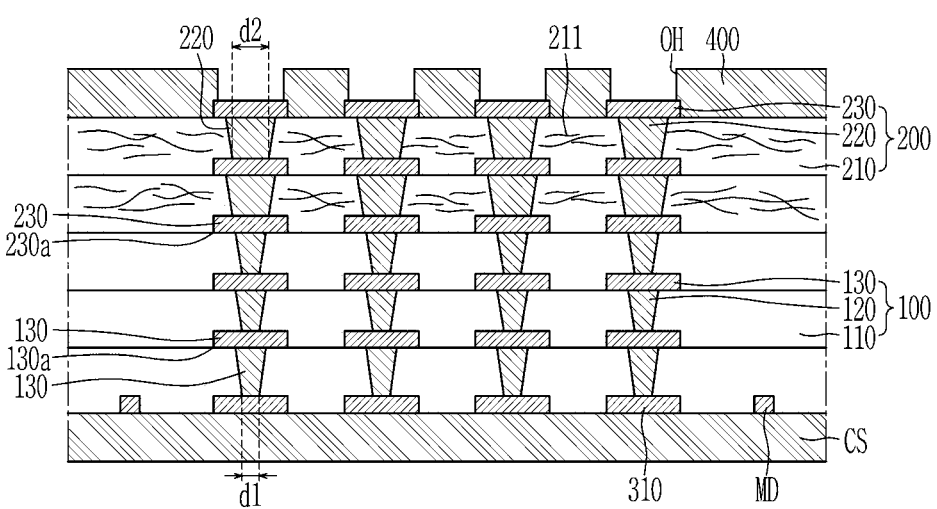
FIG. 13 is a cross-sectional view illustrating a step of a manufacturing method of a circuit board according to another embodiment.

Referring to FIG. 13 together with FIG. 12, a manufacturing method of a circuit board according to another embodiment will be described in detail.

FIG. 13 is a cross-sectional view illustrating a step of the manufacturing method of the circuit board according to the other embodiment.

The other embodiment shown in FIG. 13 is substantially the same as the embodiment shown in FIGS. 4 to 11 except that the minimum diameter of the second via layer is larger than the minimum diameter of the first via layer, and thus a repeated description thereof is omitted.

As shown in FIG. 13, the plurality of main pads 310 and the main dam MD are formed on the carrier substrate CS. Then, the first layer portion 100 including the first insulating layer 110, the first via layer 120, and the first circuit wire 130 is formed on the carrier substrate CS. Then, the second layer portion 200 including the second insulating layer 210, the second via layer 220, and the second circuit wire 230 is formed on the first layer portion 100. In this case, the minimum diameter d2 of the second via layer 220 of the second layer portion 200 may be formed greater than the minimum diameter d1 of the first via layer 120 of the first layer portion 100. As described above, the minimum diameter d2 of the second via layer 220 penetrating the second insulating layer 210 including the reinforcing material 211 may be formed larger than the minimum diameter d1 of the first via layer 120 penetrating the first insulating layer 110 not including the reinforcing material 211, so that a defect such as a crack or the like is prevented from occurring in the second via layer 220 by stress concentrated in the second insulating layer 210. Then, the solder resist layer 400 having the opening OH overlapping the second circuit wire 230 is formed on the second layer portion 200.

Then, as shown in FIG. 12, the carrier substrate CS is separated from the first layer portion 100, and the coreless substrate CLS including the first layer portion 100 and the second layer portion 200 is turned over. Then, the main pad 310 and the main dam MD protrude above the surface 110$u$ of the first insulating layer 110 of the first layer portion 100. Then, the upper corner 310$a$ of the main pad 310 and the upper corner MDa of the main dam MD are processed to make the upper corner 310$a$ of the main pad 310 and the upper corner MDa of the main dam MD into a curved shape. Then, the lower auxiliary dam DSD covering the main dam MD is formed using the first electroless plating process. Then, the auxiliary dam SD is completed by forming the upper auxiliary dam USD on the lower auxiliary dam DSD through the second electroless plating process. The auxiliary pad 300 is completed by forming the upper auxiliary dam USD and simultaneously forming the first auxiliary pad 320 covering the main pad 310. In addition, the second auxiliary pad 500 covering the surface of the second circuit wire 230 overlapping the opening OH of the second insulating layer 210 is formed while forming the upper auxiliary dam USD.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A circuit board comprising:
   a first insulating layer;
   a first via layer disposed at the first insulating layer;
   a conductive pad that protrudes above a surface of the first insulating layer and is connected to the first via layer;
   a dam that protrudes from the surface of the first insulating layer and is disposed outside a region where the conductive pad is disposed on a plane; and
   a second insulating layer that includes a material different from the first insulating layer, is disposed below the first insulating layer, and includes a reinforcing material,
   wherein a height of the dam based on the surface of the first insulating layer is higher than a height of the conductive pad, and the first via layer is tapered in a direction from the second insulating layer to the first insulating layer.

2. The circuit board of claim 1, wherein the dam comprises:

a main dam protruding above the surface of the first insulating layer; and an auxiliary dam covering the main dam.

3. The circuit board of claim 2, wherein the auxiliary dam comprises:

a lower auxiliary dam including nickel; and an upper auxiliary dam that is disposed on the lower auxiliary dam.

4. The circuit board of claim 3, wherein the upper auxiliary dam includes a first upper auxiliary dam including nickel and a second upper auxiliary dam including gold.

5. The circuit board of claim 2, wherein the conductive pad comprises:

a main pad protruding above the surface of the first insulating layer; and a first auxiliary pad covering the main pad, wherein a thickness of the auxiliary dam measured in a direction perpendicular to the surface of the first insulating layer is greater than a thickness of the first auxiliary pad.

6. The circuit board of claim 5, wherein the first auxiliary pad comprises:

a first lower auxiliary layer including nickel; and a first upper auxiliary layer that is disposed on the first lower auxiliary layer and includes gold.

7. The circuit board of claim 1, further comprising:

a first circuit wire connected to the first via layer;

a second via layer disposed at the second insulating layer; and a second circuit wire connected to the second via layer.

8. The circuit board of claim 7, wherein a minimum diameter of the second via layer is greater than a minimum diameter of the first via layer.

9. The circuit board of claim 1, wherein the first insulating layer includes a silica filler, the second insulating layer includes a silica filler and the reinforcing material, and the reinforcing material includes a glass cloth.

10. The circuit board of claim 1, further comprising a solder resist layer that is disposed below the second insulating layer and has an opening overlapping a second circuit wire disposed on the second insulating layer.

11. The circuit board of claim 10, further comprising a second auxiliary pad covering a surface of the second circuit wire that overlaps the opening.

12. The circuit board of claim 1, wherein a portion of the conductive pad is buried in the first insulating layer.

13. The circuit board of claim 1, wherein the first insulating layer does not include the reinforcing material.

14. The circuit board of claim 1, further comprising a peripheral pad on the first insulating layer, wherein the peripheral pad is disposed outside a region where the dam is disposed on a plane.

15. An electronic component package, comprising:

a circuit board comprising a first insulating layer, a first via layer disposed at the first insulating layer, a conductive pad that protrudes above a surface of the first insulating layer and is connected to the first via layer, and a dam that protrudes from the surface of the first insulating layer and is disposed outside a region where the conductive pad is disposed on a plane;

an electronic component disposed above the circuit board;

a conductive bonding member that connects the conductive pad of the circuit board to the electronic component; and an underfill that is disposed between the electronic component and the circuit board and is surrounded by the dam, wherein a height of the dam based on the surface of the first insulating layer is higher than a height of the conductive pad, and the first via layer is tapered in a direction from the circuit board to the electronic component.

16. The electronic component package of claim 15, wherein the circuit board further comprises a second insulating layer that includes a material different from the first insulating layer, is disposed below the first insulating layer, and includes a reinforcing material.

17. The electronic component package of claim 16, wherein the first insulating layer does not include a reinforcing material.

18. A circuit board comprising:

a first insulating layer including a first surface and a second surface opposing each other;

a first via layer disposed in the first insulating layer and tapered in a direction from the second surface to the first surface of the first insulating layer;

a first conductive pad including a portion embedded in the first insulating layer and another portion being in direct contact with the portion embedded in the first insulating layer and protruding from the first surface of the first insulating layer, the first conductive pad connected to the first via layer; and a dam, disposed outside a region where the first conductive pad is disposed, including a portion embedded in the first insulating layer and another portion protruding from the surface of the first insulating layer, wherein a height of the dam based on the surface of the first insulating layer is higher than a height of the first conductive pad.

19. The circuit board of claim 18, wherein the dam comprises:

a main dam protruding above the first surface of the first insulating layer and including the portion of the dam embedded in the first insulating layer; and an auxiliary dam covering the main dam.

20. The circuit board of claim 19, wherein the first conductive pad comprises:

a first main pad protruding above the first surface of the first insulating layer and including the portion of the first conductive pad embedded in the first insulating layer; and a first auxiliary pad covering the first main pad.

21. The circuit board of claim 20, wherein a radius of curvature of an upper corner of the first main pad is greater than a radius of curvature of a corner of a first circuit wire disposed on the first insulating layer.

22. The circuit board of claim 18, further comprising a second insulating layer disposed below the first insulating layer and including a reinforcing material.

23. The circuit board of claim 22, wherein a minimum diameter of a second via layer in the second insulating layer is greater than a minimum diameter of the first via layer in the first insulating layer.

24. The circuit board of claim 18, further comprising a second conductive pad including a portion embedded in the first insulating layer and another portion protruding from the surface of the first insulating layer, wherein the second conductive pad is disposed outside a region of the dam, and has a height less than that of the dam with respect to the first surface of the first insulating layer.

25. The circuit board of claim 24, wherein the second conductive pad comprises:

a second main pad protruding above the first surface of the first insulating layer and including the portion of the second conductive pad embedded in the first insulating layer; and a second auxiliary pad covering the second main pad.

* * * * *